United States Patent [19]
Davies

[11] 4,245,231
[45] Jan. 13, 1981

[54] COMBINATION CAPACITOR AND TRANSISTOR STRUCTURE FOR USE IN MONOLITHIC CIRCUITS

[75] Inventor: Robert B. Davies, Tempe, Ariz.

[73] Assignee: Motorola Inc., Schaumburg, Ill.

[21] Appl. No.: 973,407

[22] Filed: Dec. 26, 1978

[51] Int. Cl.$^3$ ............................................. H01L 27/02
[52] U.S. Cl. ........................................ 357/51; 357/48; 357/52; 357/55
[58] Field of Search ......................... 357/51, 48, 52, 55

[56] References Cited
U.S. PATENT DOCUMENTS 3,953,875  4/1976  Cave et al. ............................. 357/51

Primary Examiner—Edward J. Wojciechowicz
Attorney, Agent, or Firm—Michael D. Bingham

[57] ABSTRACT

A combination capacitor and transistor structure is described wherein the capacitor is formed integrally with the emitter electrode of the transistor. The transistor is formed in a monolithic integrated circuit using generally known techniques and constitutes a vertically integrated PNP device. The emitter electrode of the transistor which comprises a P+ diffusion region is of a predetermined area which is large enough to form the bottom plate of the capacitor. The top plate of the capacitor is formed by growing a dielectric material over the diffused emitter region and then forming metallization thereover. The combination capacitor and transistor structure may be utilized in a bias network for biasing the output stage of an operational amplifier in a class AB mode. The capacitor formed in the combination structure may be utilized as the compensation capacitor in such operational amplifier which utilizes pole splitting techniques. The improvement provided by the invention reduces the surface area of the semiconductor die chip required to form the capacitor and transistor which facilitates greater device density on a particular die chip.

3 Claims, 2 Drawing Figures

COMBINATION CAPACITOR AND TRANSISTOR STRUCTURE FOR USE IN MONOLITHIC CIRCUITS

BACKGROUND OF THE INVENTION

This invention relates to operational amplifiers operated in class AB mode and more particularly to a combination capacitor structure and transistor circuit for providing bias to the output stages of the operational amplifiers for facilitating class AB modes of operation.

Contemporary high performance operational amplifiers generally are operated in a class AB mode and comprise a cascaded output section including an NPN and PNP output transistors. The PNP output transistor is usually coupled to a bias circuit which biases the transistor in a class AB mode of operation. Thus, the amplifier is characterized by low current drain and good fidelity. Examples of high performance operational amplifiers which may be operated in class AB modes are the MC1458 and MC1741 operational amplifiers manufactured by Motorola, Inc. These operational amplifiers use a compensation capacitor and pole splitting techniques to set the transfer characteristics of the amplifiers. The compensation capacitor is typically anywhere from 5–30 picofarads and is constructed integrally with the monolithic integrated operational amplifier. In these operational amplifiers substantial semiconductor die real estate is required for the capacitor which may be a disproportionate portion of the total semiconductor area required for the circuit. Furthermore, contemporary operational amplifiers usually utilize an NPN device for biasing the PNP output device in a class AB mode. This creates an inherent mismatch between the two devices which may require more current drain through the output stage than desirable and with less predictable currents being defined which in turn affects the operation of the operational amplifier.

In the design of high performance operational amplifiers it is very desirable to reduce the current drain through the output stages as much as possible to reduce the amount of total drain current required by the amplifier. However, even though the goal is to reduce the current drain in the output stage, it is also important that predictable currents be obtained. Moreover, as the tendancy is to make integrated circuits more complex, it is significant to be able to reduce the die surface area which is required to fabricate an operating circuit.

In view of the above, a need exists for providing a bias circuit for high performance operational amplifiers which can reduce the current drain through the output stage as well as reducing the die surface area required for fabricating the operational amplifier circuit.

SUMMARY OF THE INVENTION

The object of the present invention is to provide a combination capacitor and transistor structure for facilitating class AB bias to the output stage of an operational amplifier while minimizing integrated circuit chip area required for said combination.

The invention relates to a combination capacitor and transistor structure for use in a bias circuit. The combination capacitor and transistor structure includes a transistor having its emitter electrode integrally formed as a bottom plate of the capacitor and its base electrode coupled to a node which may be connected to an output device in an output stage of an operational amplifier which is required to be biased in a class AB mode of operation. The transistor may be part of a bias network which establishes the class AB bias to the output device.

The transistor structure is formed using general vertical bipolar techniques wherein a substrate material of a first conductivity type is used with an epitaxial region of a second conductivity type formed on said substrate region and having an outwardly facing surface. A second region of said first conductivity type is formed in said epitaxial region which has an outwardly facing surface substantially coplanar with said surface of said epitaxial region with said second region having a predetermined surface area which forms both the emitter diffused region of the transistor and the bottom plate of the capacitor structure. A layer of dielectric material is formed over the emitter diffused or second region area which has a layer of metallization formed thereover to form the top plate of the capacitor. Thus, as described, there is formed a capacitor in series with the emitter electrode of the transistor wherein the combination structure can be utilized in a biasing network for biasing the output stage of generally known operation amplifiers in a class AB mode of operation without requiring mutually exclusive semiconductor die areas for formation of the aforesaid transistor and capacitor.

DETAILED DESCRIPTION OF THE PREFERRED EMBODIMENT

Figure 1:
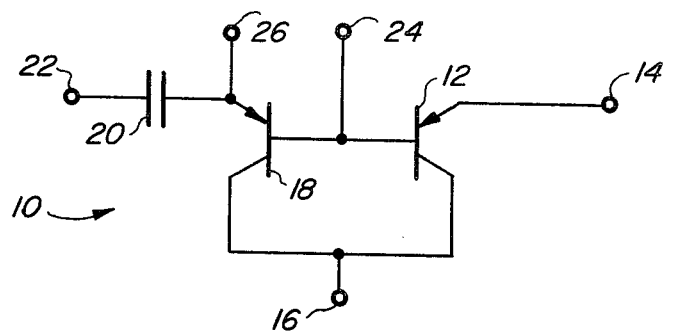
FIG. 1 is a schematic diagram of a combination capacitor and transistor structure of the embodiment of the invention which is suitable for fabrication in monolithic integrated circuit form.

FIG. 1 is a schematic diagram illustrating the embodiment of the present invention. More specifically, in a practical application the invention may be utilized in an operational amplifier which is operated in a class AB mode. An example of an operational amplifier in which the invention may be utilized is the MC1458 and MC1741 monolithic amplifiers which are two of a group of operational amplifiers manufactured by Motorola, Inc.

The circuit shown by reference numeral 10 would form part of the class AB bias circuitry which is utilized to bias the cascaded output stage of the aforementioned operational amplifiers. For example, PNP transistor 12 would be one of the output cascaded devices of the output stage of the amplifier having its emitter connected to node 14 which would be the output of the operational amplifier. Coupled in cascade with the output node 14 would be an NPN output device. The collector electrode of transistor 12 is connected to node 16 at which may be supplied a source of negative potential or, if desired, a ground reference potential.

PNP transistor 18 which in combination with compensation capacitor 20 comprise the combination structure of the invention may be included in the aforedescribed bias network for biasing the operational amplifier in a class AB mode. Compensation capacitor 20 provides the dominate pole of the transfer function of the operational amplifier and set the first break point, as is known. As shown, one plate of capacitor 20 is connected to node 22 which may be coupled to an input stage if the combination structure is used in an operational amplifier circuit. The other plate of capacitor 20 is integrally formed with the emitter electrode of transistor 18 to constitute the invention. The base electrode of transistor 18 is integrally connected to the base electrode of transistor 12 at node 24.

Transistor 18, if utilized in the bias circuitry for setting the AB bias for output device 12, is usually shown in the prior art as an NPN device. However, by using a PNP device the characteristics of transistor 18 can be matched to that of the PNP output device transistor 12 for better circuit operation. Generally, it is desirable to have the currents through transistor 12 and 18 well defined. Moreover, as transistor 18 sets the AB bias conditions for transistor 12 it is desirable to have the magnitude of the voltage at node 26 larger than the value of the voltage at node 14 while maintaining current drain through the output stage of the operational amplifier (including transistor 12) at a minimum.

By area rationing the emitter areas of transistors 12 and 18 with respect to each other wherein the emitter area of transistor 18 is N times larger than emitter area of transistor 12 the above goals can be met. Thus, a defined current is maintained through transistor 18 to define a smaller quiescent operating current through transistor 12.

At the same time it may be shown that the utilization of a larger emitter area for transistor 12 permits the combination therewith of the required compensation capacitor 20. Hence, the use of a PNP transistor as a portion of the biasing circuit for operating the operational amplifier in a class AB mode allows the novel combination structure shown in FIG. 1.

The advantage of the aforedescribed combination capacitor and transistor structure is that no increase in semiconductor die area is required since the increased emitter area provides the bottom plate of capacitor 20. Therefore, a reduction in die area may be realized by the aforedescribed combination. This reduction in semiconductor die area becomes significant when it is considered that the combination capacitor and transistor structure may be utilized in an operational amplifier wherein the operational amplifier is either a dual or quad type operational amplifier where multi-operational amplifiers are fabricated on one semiconductor monolithic integrated chip.

Figure 2:
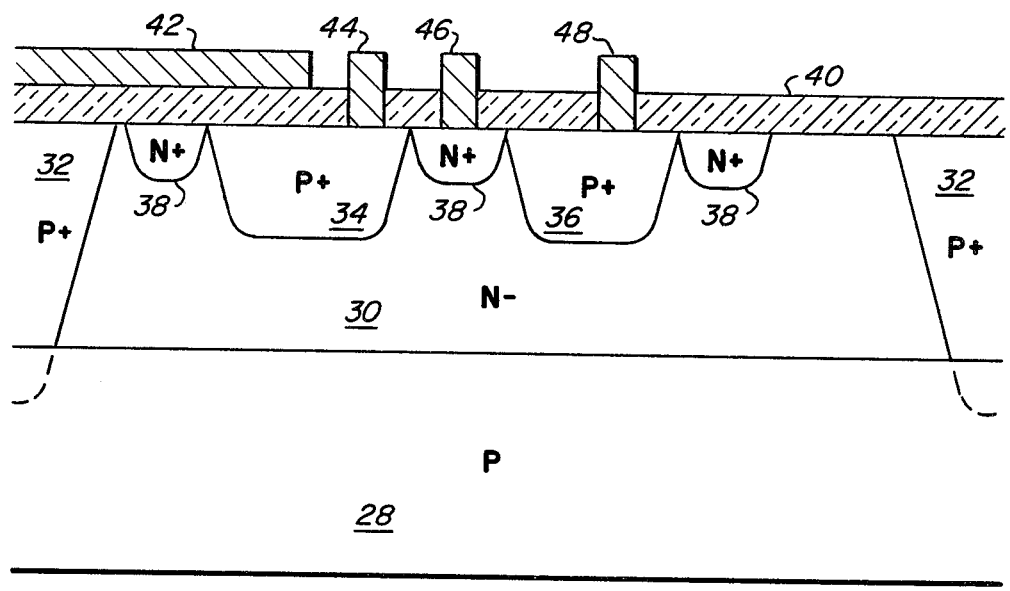
FIG. 2 is a cross-sectional view of a semiconductor die illustrating the embodiment of the capacitor and transistor structure of FIG. 1.

Turning to FIG. 2 there is shown a cross-sectional view of the circuit structure shown in FIG. 1. The structure includes a P-type substrate 28 which comprises the collector electrodes of transistors 12 and 18. A layer of N-type epitaxial semiconductor material 30 is provided over substrate 28 and has an outwardly facing surface. The growth of the epitaxial semiconductor material over substrate 28 utilizes well known fabrication techniques. Further, using known monolithic photolithographic techniques, P+ isolated regions 32, as well as P+ emitter regions 34 and 36 are diffused into epitaxial region 30. As shown, the area of emitter diffused region 34 which comprises the emitter electrode of transistor 18 is larger than the emitter diffused region 36 which forms the emitter electrode of transistor 12. Additionally, N+ regions 38 are diffused into epitaxial region 30. Next, a layer of dielectric material 40 is placed or formed over the surface of the resulting semiconductor structure and openings are selectively provided using photoetching techniques. Then, a layer of metallization is applied over the dielectric material 40 and selectively patterned to provide different contacts. For example, metallization layer 42 which is spaced over a portion of the emitter diffused region of transistor 18 provides the top plate of capacitor 20. The bottom plate of capacitor 20 is formed by the emitter diffused region 34. Metallization contacts 44, 46 and 48 provide contact means with the electrode of transistor 18, the interconnected base electrodes of transistors 12 and 18, and the emitter electrode of transistor 12 respectively. Thus, as shown the combination capacitor structure and transistor 20 and 18 are integrally formed utilizing the emitter diffusion region for the transistor. Thus, a separate portion of the semiconductor chip surface area is not required to form capacitor 20 and transistor 18.

What has been described, therefore, is an improved monolithic integrated circuit comprising a combination capacitor and transistor structure. This combination structure may be utilized in the bias circuitry of monolithic integrated operational amplifiers to bias the output stage of such operational amplifiers in a class AB mode. Since the capacitor structure is formed integrally and overlies an otherwise necessary emitter diffusion region the capacitor structure takes up virtually no additional surface area on the integrated circuit chip. Therefore, more integrated circuits can be provided per wafer than if other types of capacitor structures were utilized.

What is claimed is:

1. In a monolithic integrated circuit having a substrate region of semiconductor material of a first conductivity type, an epitaxial region of semiconductor material of a second conductivity type formed on the substrate region, a portion of the epitaxial region being isolated by an isolation region of semiconductor material of the first conductive type from the remainder thereof wherein an isolation pocket of the epitaxial region is defined, a combination capacitor and transistor structure, the improvement comprising:

the isolated epitaxial pocket region having an outwardly planar facing surface and being the base region of the transistor, the substrate region lying under the isolated epitaxial pocket region being the collector region of the transistor;

a first defined region of semiconductor material of the first conductivity type formed in the isolated epitaxial pocket region and having an outwardly facing surface coplanar with said outwardly facing surface of said isolated epitaxial pocket region, said first region being the emitter region of the transistor;

a layer of dielectric material formed over said first region;

a layer of metallic material formed over the dielectric material and said first region; and said layer of metallic material, in combination with said dielectric material and said first region forming a capacitor with said metallic material being a first plate of the capacitor and the active emitter region of the transistor being a second plate of the capacitor wherein the combined capacitor and transistor structure is realized by the capacitor being formed integrally with the active emitter region of the transistor.

2. The monolithic integrated circuit of claim 3 wherein said substrate region is of a P conductivity type, said first region is of said N− conductivity type, and said second and third regions are of said P+ conductivity type.

3. The monolithic integrated circuit of claim 1 including:
a second defined region of semiconductor material of said first conductivity type formed in the isolated epitaxial pocket region in spaced relationship to said first region, said second region having an outwardly facing surface and forming with the substrate region and the isolated epitaxial pocket region a second transistor of the same conductivity type as the transistor of the combination transistor and capacitor structure.

* * * * *

UNITED STATES PATENT AND TRADEMARK OFFICE
CERTIFICATE OF CORRECTION

PATENT NO. : 4,245,231
DATED : 01/13/81
INVENTOR(S) : Davies, Robert B.

It is certified that error appears in the above-identified patent and that said Letters Patent are hereby corrected as shown below:

Claim 2 should be renumbered claim 3, in line 1, numeral "3" should be changed to --2--; and claim 3 should be renumbered claim 2.

Signed and Sealed this

Twenty-sixth Day of May 1981

[SEAL]

Attest:

RENE D. TEGTMEYER

Attesting Officer

Acting Commissioner of Patents and Trademarks